United States Patent [19]

Kitagawa et al.

[11] 4,077,031
[45] Feb. 28, 1978

[54] HIGH SPEED ADDRESS BUFFER FOR SEMICONDUCTOR MEMORY

[75] Inventors: Norihisa Kitagawa; Lionel Stuart White, Jr., both of Houston, Tex.

[73] Assignee: Texas Instruments Incorporated, Dallas, Tex.

[21] Appl. No.: 716,843

[22] Filed: Aug. 23, 1976

[51] Int. Cl.² ............................................. G11C 8/00
[52] U.S. Cl. .................................. 365/205; 307/238; 307/279; 365/203
[58] Field of Search ..................... 340/173 R, 173 FF; 307/238, 279

[56] References Cited

U.S. PATENT DOCUMENTS

| | | | |
|---|---|---|---|
| 3,959,781 | 5/1976 | Mehta et al. | 340/173 R |
| 3,983,412 | 9/1976 | Roberts et al. | 340/173 FF |

Primary Examiner—Stuart N. Hecker
Attorney, Agent, or Firm—James T. Comfort; Charles J. Fassbender

[57] ABSTRACT

Disclosed is an address buffer circuit for use in semiconductor memories. The buffer includes a pair of cross-coupled transistors having set and reset nodes that are precharged to a predetermined level prior to sensing the input address signals. The set and reset nodes couple to a pair of load transistors that are also precharged prior to sensing. Actual sensing occurs by further charging or discharging the set and reset nodes at rates that reflect the state of the input address signal. A current sinking circuit detects the different charge or discharge rate and selectively sinks the precharge on one load transistor thereby latching the state of the input address signal.

18 Claims, 5 Drawing Figures

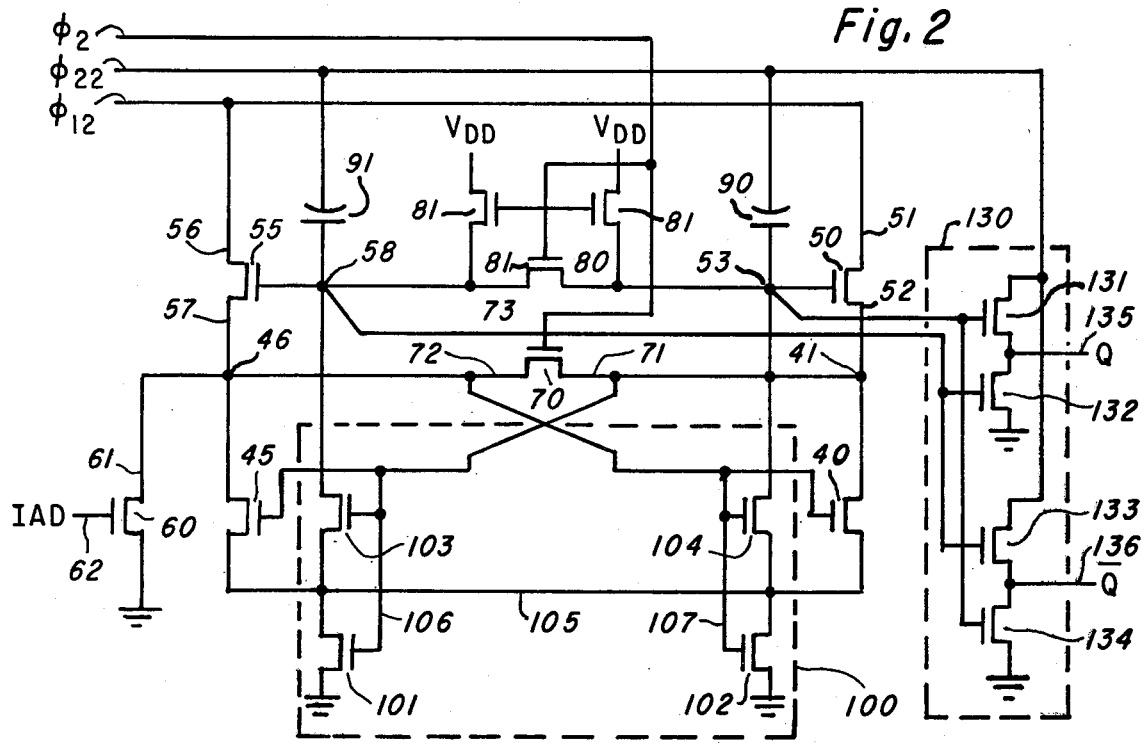

ular embodi-
HIGH SPEED ADDRESS BUFFER FOR SEMICONDUCTOR MEMORY

BACKGROUND OF THE INVENTION

Semiconductor integrated circuits have great advantages in computer memory. The cost per bit of storage, and the speed of operation, provided by N-channel MOS random access memory (RAM) devices have resulted in their wide use in digital equipment, particularly minicomputers. One example of such a device, a 4096-bit RAM, is shown and described in U.S. Pat. No. 3,909,631, filed Aug. 2, 1973, by Norishisa Kitagawa, assigned to Texas Instruments Incorporated.

Typically, a semiconductor RAM accepts a multiple bit address from external circuitry, which address functions to select a specific cell (or cells) within the RAM for writing in data or reading out data. The address is generated by other parts of the system, separate from the RAM. Thus, a requirement placed on the circuitry of the RAM is that the timing and voltage levels (or logic levels) of the address signals to which it responds must be compatible with the remainder of the system.

Often, the voltage levels of the input address to a memory are low level bipolar voltage levels, such as TTL, rather than high voltage levels such as MOS; and low voltage input address signals create a design problem for the input address buffer. This is because such signals do not fully turn on MOS logic gates; and thus, are difficult to sense. Yet, the sensing of such signals must be performed both accurately and rapidly to enable the memory system to be reliable and fast.

In the past, input address buffers have been designed to operate with low voltage address signals. One example of an address buffer is shown in copending U.S. Patent Application Ser. No. 624,813, filed Oct. 22, 1975, by Redwine and Kitagawa, assigned to Texas Instruments; while this buffer circuit represented an improvement in speed, low power and noise level, there is a continuing need for improvement in these factors as the density of memories increases.

It is therefore an object of the invention to provide an improved circuit for detecting memory address signals.

It is another object of the invention to provide an input address buffer with relatively fast operating characteristics.

It is still another object of the invention to provide an input address buffer which accurately detects low voltage level input signals.

SUMMARY OF THE INVENTION

These and other objectives are accomplished in accordance with the invention by a pair of cross-coupled transistors having set and reset nodes that are initially precharged to a predetermined level. The set and reset nodes couple to a pair of load transistors; and each load transistor has a control node that is initially precharged to another level.

An input address signal is sensed by further charging (or discharging) the precharge voltage on the set and reset nodes at two different rates. These rates reflect the state of the input address signal.

A current sinking circuit senses the different charge (or discharge) rates. In response, the current sinking circuit selectively sinks the precharge from the set or reset node and from the corresponding load transistor control node. The state of the input address signal is thereby latched on the load transistor control nodes.

BRIEF DESCRIPTION OF THE DRAWINGS

The novel features believed characteristic of the invention are set forth in the appended claims; the invention itself, however, as well as other features and advantages thereof, may best be understood by referring to the following detailed description of particular embodiments when read in reference to the accompanying drawings, wherein:

FIG. 2 is a circuit diagram of a specific embodiment of the invention;

FIG. 3 is a graphic representation of voltages appearing on selected nodes in the circuit of FIG. 2;

DETAILED DESCRIPTION OF SPECIFIC EMBODIMENTS

Figure 1:
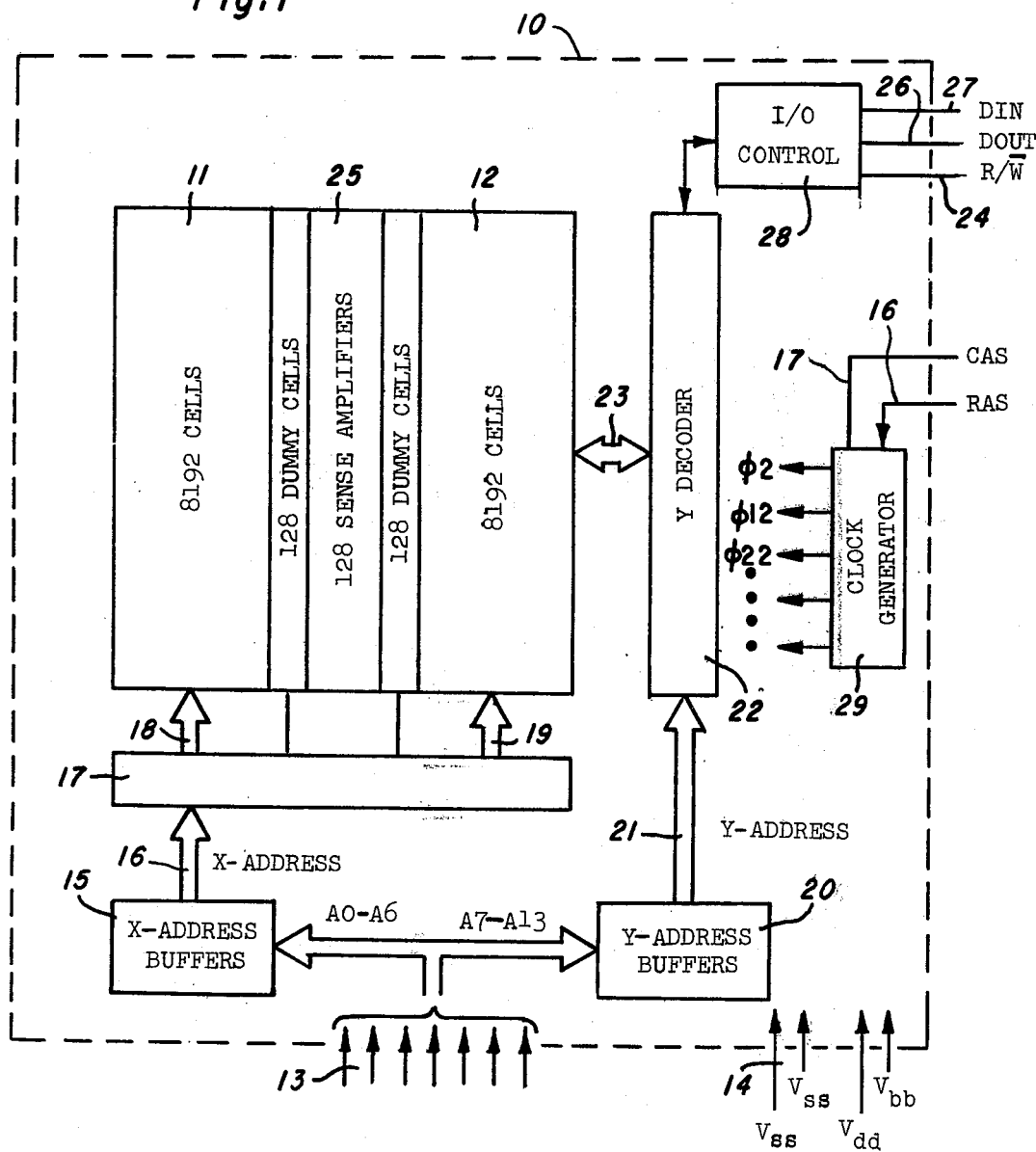
FIG. 1 is a block diagram of a semiconductor memory device which may utilize the invention.

Referring to FIG. 1, a semiconductor memory device which may utilize the invention is illustrated in block diagram form. The memory device is incorporated within a semiconductor chip or bar 10 which may be an N-channel, silicon gate MOS/LSI device mounted in a 16 pin plastic "dual-in-line" package in accordance with standard practice within this industry. The chip 10 includes 16,384 memory cells which are arranged in two cell matrixes 11 and 12, each of which contains 8,197 cells. The 16,384 cells are in an array of 128 rows and 128 columns; the cell matrix 11 contains rows X0 to X63 while the cell matrix 12 contains rows X64 to X127; columns Y0 to Y127 are contained in both cell matrix 11 and cell matrix 12. Only one cell of the 16,384 cells is addressed at a given time; this requires a seven-bit (one of 128) X address A0 to A6 which is applied to address pins 13, as well as a seven-bit (one of 128) Y address A7 to A13 also applied to address pins 13.

The X address is applied from pins 13 to seven X address buffers 15 (constructed according to the invention) which generate seven address signals and their complements on lines 16 to be applied on an X decoder 17 that may be of conventional form. The X decoder 17 provides selection of 1-of-64 row address lines 18 going to cell matrix 11 and 1-of-64 row address lines 19 going to cell matrix 12. In addition, selection of dummy cells in the non-selected matrix is provided by the X decoder according to U.S. Pat. No. 3,909,631.

In like manner, the Y address is applied from pins 13 to seven Y address buffers 20 (constructed according to the invention) which generate seven binary address signals and their complements on lines 21 to be applied to a Y decoder 22 which may be of the type described in U.S. Pat. 3,909,631. The Y decoder 22 provies selection of 1-of-64 column lines 23 which are the column lines within the cell matrixes 11 and 12. Each column line is bisected by a one of a set of 128 sense amplifiers 25 which function to detect the low level signals produced by the memory cells and provide a full logic level readout for refresh or system output. The Y decoder 22 also provides input/output date transfer; and data input and output lines 27 and 26 connect to the Y decoder via I/O control circuitry 28. Another pin 24 provides read/write (R/W) select. A selection signal for the chip 10 is provided by "Row Address Strobe" $\overline{RAS}$ and "Column Address Strobe" $\overline{CAS}$ input pins 16, 17 which are connected to clock generator circuitry 29. Various clock pulses such as 02, 012, 022, etc., used within the chip are produced by the circuitry 29, based on the $\overline{RAS}$ and $\overline{CAS}$ inputs. Supply voltages for the chip 10 are provided by input pins 14 for Vdd which is about +12 volts, ground or Vss, and substrate bias Vbb, which is about −5 volts.

Referring to FIG. 2, a circuit diagram of an address buffer comprising one embodiment of the invention is illustrated. The primary elements of this embodiment are a set transistor 40, a reset transistor 45, a first clocked load transistor 50, a second clocked load transistor 55, an address input transistor 60, an equalizing transistor 70, a percharge circuit 80, a pair of booting capacitors 90, and 91, a current sinking circuit 100, and an output circuit 130.

Set transistor 40 and reset transistor 45 are cross-coupled to form a set node 41 and a reset node 46. This cross-coupled pair is unbalanced either by making the transistors 40 and 45 of different size, by making the capacitance of reset node 46 slightly smaller than the capacitance of set node 41, or both.

First clocked load transistor 50 charges set node 41 via a source 51 coupled to a clock signal O12 and a drain 52 coupled to set node 41. Similarly, second clocked load transistor 55 charges reset node 46 via a source 56 coupled to clock signal 012 and a drain 57 coupled to reset node 46.

The conductivity of load transistor 50 is varied by varying the voltage V53 on a set control node 53. Node 53 is coupled to the gate of transistor 50. The voltage V53 is varied by means of a precharge circuit 80, a stepping capacitor 90, and a current sinking means 100, all of which are coupled to node 53.

Similarly, the conductivity of load transistor 55 is varied by varying the voltage V58 on a reset control node 58. Node 58 is coupled to the gate of transistor 55. The voltage V58 is varied by means of the precharge circuit 80, a stepping capacitor 91, the current sinking means 100, and an address input transistor 60.

Voltages V53 and V58 direct the state of output circuit 130. Output circuit 130 includes an output load transistor 131 having a gate coupled to node 53, and an output driver transistor 132 having a gate coupled to node 58. An output signal Q is formed on a lead 135 which connects the drain of transistor 131 to the source of transistor 132.

Similarly, output circuit 130 also includes an output load transistor 133 having a gate coupled to node 58 and an output driver transistor 134 having a gate coupled to node 53. An output signal $\overline{Q}$ is formed on a lead 136 which connects the drain of transistor 133 to the source of transistor 134.

The detailed manner in which the above elements of the invention interact is best understood by referring to the timing diagram of FIG. 3 in conjunction with the circuit diagram of FIG. 2. During a first time interval 110, the circuit is initialized to a predetermined state, from which a low level (typically T²L) address signal IAD will subsequently be sensed, converted to MOS voltage levels, and latched. Time interval 110 is entered by raising a clock signal 02 to a high MOS voltage level (typically about +12 volts), and by lowering clock signals 012 and 022 to a low voltage level near ground.

Clock signal 012 couples to the source of load transistors 50 and 55. Therefore, when signal 012 is at a low voltage, load transistors 50 and 55 supply no charge to set node 41 and reset node 46.

Clock signal 022 couples to one side of both booting capacitors 90 and 91. Therefore, when signal 022 is at a low voltage level, the voltage on set control node 53 and reset control node 58 is referenced to ground.

Clock signal 02 couples to gate 73 of equalizing transistor 70. Transistor 70 has a source 71 coupled to set node 41, and has a drain 72 coupled to reset node 46. Therefore, a high MOS voltage level on clock signal 02 turns on transistor 70 and thereby equalizes the voltages on nodes 41 and 46.

Due to the operation of current sinking circuit 100, the magnitude of this equalized voltage is nearly at ground level. This is because set node 41 couples to the gate 106 of a sink transistor 101; and therefore, transistors 101 and 45 both turn on and sink current away from reset node 46 whenever the voltage on set node 41 is greater than one threshold. Similarly, reset node 46 couples to the gate 107 of a sink transistor 102; and therefore, transistors 102 and 40 both turn on and sink current away from set node 41 whenever the voltage on set node 46 is greater than one threshold.

Clock signal 02 also couples to the gates of three transistors 81 in precharge circuit 80. All three transistors turn on in response to a high voltage level on signal 02. This action precharges set control node 53 and reset control node 58 to a voltage of approximately one threshold below the voltage level of signal 02. This precharge level makes both load transistors slightly conductive. The charge is not sinked away by sink transistors 103 and 104 because the gate of transistors 103 and 104 is coupled to set node 41 and reset node 46, respectively; and the voltage on these nodes is nearly ground as previously described. The circuit, therefore, stabilizes in a state where nodes 53 and 58 have a precharge potential, and nodes 41 and 46 are near ground level.

The precharge potential on nodes 53 and 58 directs output signals Q and $\overline{Q}$ to be at a low voltage level. Voltage V53 turns on transistor 134 thereby coupling lead 136 to ground. Similarly, voltage V58 turns on transistor 132 thereby coupling lead 135 to ground.

During a second time interval 111, clock signal 02 goes to a low voltage level near ground. In response, equalizing transistor 70 turns off, and also precharge transistors 81 turn off. The circuit is thus conditioned to begin sensing the low level address signal IAD. Actual sensing begins when clock signal 012 goes to a high MOS voltage level. Typically, actual sensing occurs as soon as clock signal 02 goes low.

When clock signal 010 goes to a high voltage level, a third time interval 112 is entered. During interval 112, both load transistors 50 and 55 slightly conduct. The actual conductivity is determined by the precharge voltage on set control node 53 and reset control node 57 as previously described.

The conduction of load transistors 50 and 55 raises the voltage on both set node 41 and reset node 46. But the voltage on one node rises faster than the voltage on the other node. If address signal IAD is a T²L high voltage level, transistor 60 conducts a small amount of charge away from reset node 46 and, therefore, the voltage on set node 41 rises faster. On the other hand, if address signal IAD is a low voltage level, transistor 60 turns off and, therefore, the voltage on reset node 46 rises faster. This is because node 46 has a smaller capacitance than node 41, as previously described.

During time interval 112, the voltage on nodes 41 and 46 continues to rise at different rates; and eventually, the voltage on one of these nodes becomes a threshold level above the voltage on node 105. When this occurs, time interval 112 ends and time interval 113 begins. Typically, interval 112 lasts approximately 10 ns.

During interval 113, only one of the nodes 41 and 46 continues to charge, while the other node discharges. If set node 41 has the faster rising voltage during interval 112, then it reaches the above-described threshold level, causing node 46 to discharge through transistors 45 and 101 and causing node 58 to discharge through transistors 103 and 101. On the other hand, if node 46 has the faster rising voltage during interval 112, then it reaches the above-described threshold level, causing node 41 to discharge through transistors 40 and 102 and causing node 53 to discharge through transistors 104 and 102.

Output signals Q and $\overline{Q}$ respond to the voltage levels on nodes 53 and 58, and thereby indicate the state of input signal IAD. If node 53 discharges during interval 113, then transistors 131 and 134 turn off, signal $\overline{Q}$ goes to a high voltage level, and signal Q remains at a low voltage level. On the other hand, if node 58 discharges during interval 113, then transistors 132 and 133 turn off, signal Q goes to a high voltage level, and signal Q remains at a low voltage level. FIG. 3 illustrates this latter case.

The voltage difference between set node 41 and reset node 46 is very small when time interval 113 is entered. Typically, it is approximately only 500 mv. But this voltage difference rapidly increases during interval 113. This is because current sinking circuit 100 quickly sinks one node to ground, while clock signal 022 on booting capacitors 90 and 91 increases the conductivity of load transistors 50 and 55, thereby quickly charging the other node. Time interval 113 ends when this voltage difference is large enough to allow input address signal IAD to change state with no adverse effect on the latching operation. Typically, interval 113 lasts only approximately 15 ns.

During a fifth time interval 114, input signal IAD is free to change state; yet the voltages on nodes 53 and 58 remain unchanged. This is because once node 53 or node 58 is discharged, it remains discharged until the precharge potential is reapplied. Nodes 53 and 58, therefore, reflects the latched input address signal IAD converted to MOS voltage levels.

During a sixth time interval 115, clock signal 02 goes to a high voltage level, and clock signals 012 and 022 go to a low voltage level. This activates precharge circuit 80 and equalizing transistor 70. Therefore, the previously latched voltages on nodes 53 and 58 dissipate and the precharge voltages of time interval 110 arise. The circuit is then in its original state and is ready to perform another latching operation.

Figure 4:
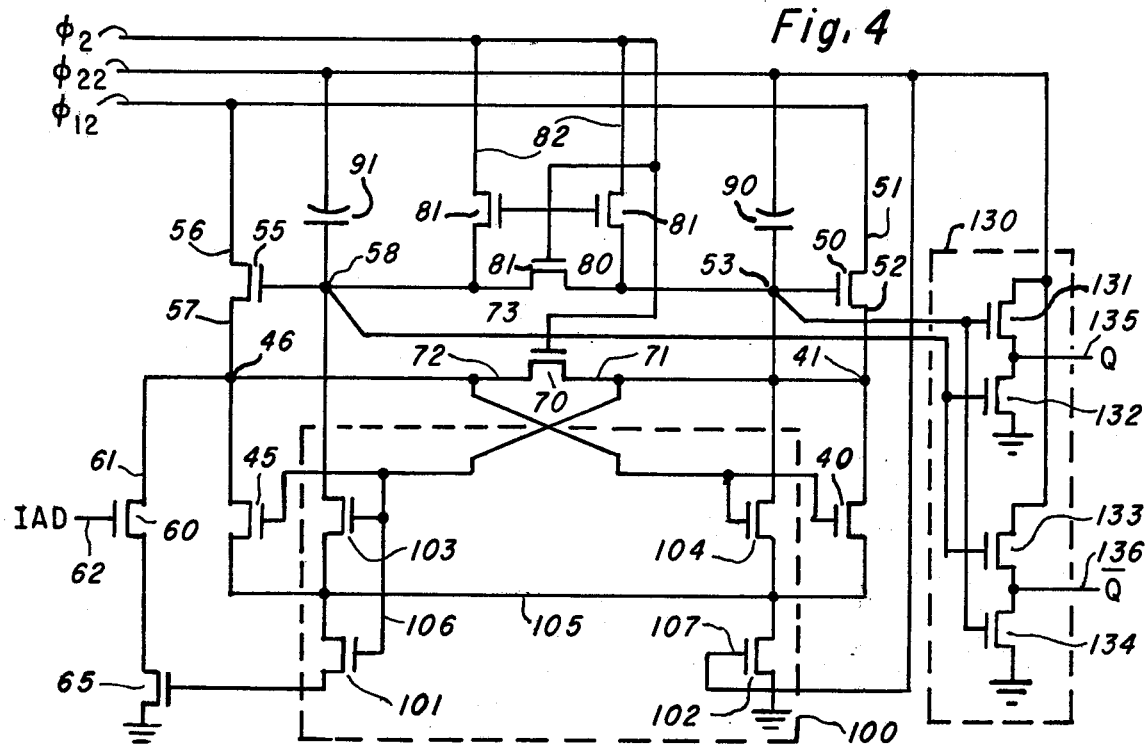
FIG. 4 is a circuit diagram of another specific embodiment of the invention.

Referring to FIG. 4, a second embodiment of the invention is illustrated. The structure of this embodiment is similar to the structure of the first embodiment with the following exceptions. Sources 82 of precharge transistors 81 are coupled to clock signal 02 instead of constant voltage source VDD. Gate 107 of sink transistor 102 is coupled to clock signal 022 instead of reset node 46. Gate 106 of sink transistor 101 is coupled to clock signal 012 instead of set node 41. A second address input transistor 65 is coupled in series with input transistor 60. And, node 41 has a slightly smaller capacitance than node 46.

Figure 5:
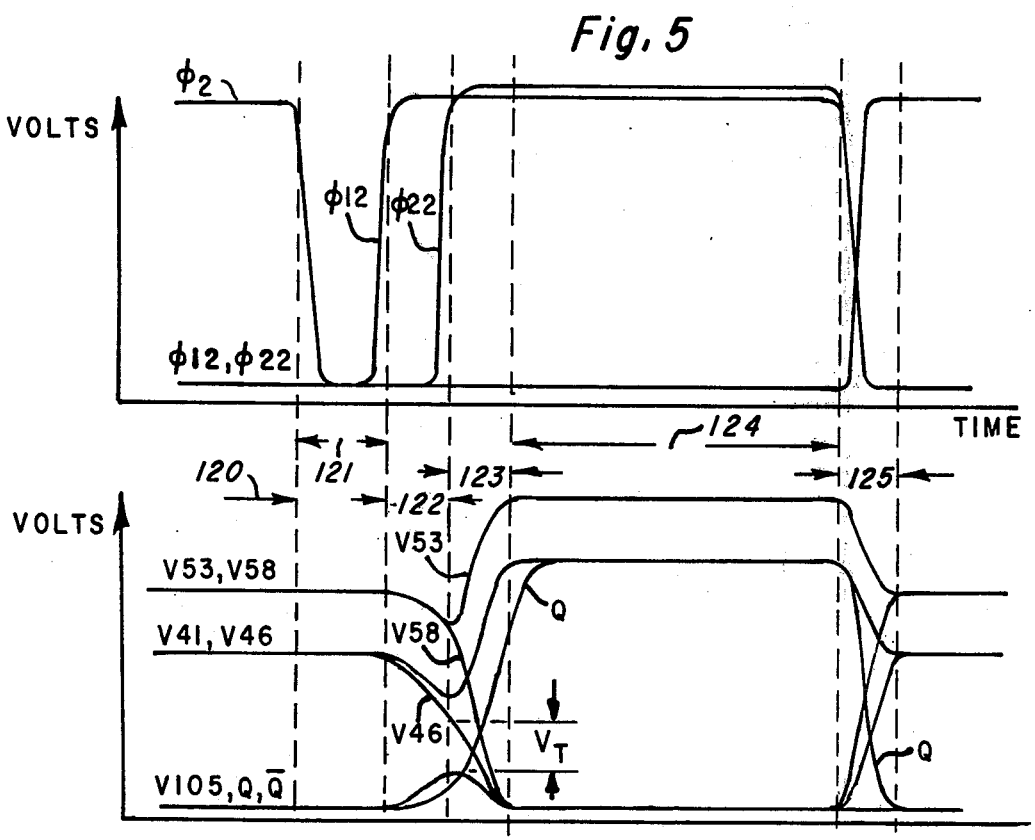
FIG. 5 is a graphic representation of voltages appearing on selected nodes in the circuit of FIG. 4.

The operation of the circuit of FIG. 4 is illustrated by the timing diagram of FIG. 5. During a time interval 120, precharge circuit 80 is activated by clock signal 02. This precharges nodes 53 and 58 to the voltage level of clock 02 minus one threshold drop; and it further precharges nodes 41 and 46 to the voltage level of clock 02 minus two threshold drops. The reason nodes 41 and 46 precharge, rather than discharge to ground as in the first embodiment, is that clock signal 012 turns off sink transistor 106 and clock signal 022 turns off sink transistor 102, thereby opening the discharge path. Signals Q and $\overline{Q}$ are both at low voltage levels during this time interval due to the precharge voltage on nodes 41 and 46.

During a time interval 121, clock signal 02 goes to a low voltage level, thereby terminating the precharge operation.

During a time interval 122, clock signal 012 goes to a high voltage level, thereby initializing a sensing operation. Sensing is implemented by discharging nodes 41 and 46 at different rates, as opposed to charging nodes 41 and 46 at different rates as in the first embodiment.

If input address signal IAD is at a high T$^2$L voltage level, then transistor 60 turns on slightly, and thus, node 46 discharges faster than node 41. If input address signal IAD is at a low voltage level, then transistor 60 turns off, and thus, node 41 discharges faster than node 46 due to its smaller capacitance. When the voltage between the faster discharging node and node 105 becomes less than one threshold level, time interval 122 ends and time interval 123 begins.

During interval 123 nodes 41 and 53 charge while nodes 46 and 58 discharge, or vise versa. If node 41 is the faster discharging node, then transistors 45 and 103 turn off, nodes 46 and 58 charge, nodes 41 and 53 discharge, and signal Q goes to a high voltage level. If node 46 is the faster discharging node, then transistors 40 and 104 turn off, nodes 41 and 53 charge, nodes 46 and 58 discharge, and signal Q goes to a high voltage level. FIG. 5 illustrates this latter case. Charging occurs rapidly because the high voltage level of clock signal 022 increases the conductivity of transistors 50 and 55; and discharging also occurs rapidly because the high voltage level of clock signal 022 turns on sink transistor 102. Time interval 123 ends when the voltage difference between nodes 41 and 46, 53 and 58 is large enough to allow input address signal IAD to change state without adversely affecting the latching operation.

During time interval 124, input signal IAD may change state; but the voltage on nodes 53 and 58 are latched, and thus signals Q and $\overline{Q}$ will not change.

During time interval 125, the precharging operation begins and the circuit is returned to its initial state.

Various embodiments of the invention have now been described in detail. Since it is obvious that many changes and modifications can be made in the above details without departing from the nature and spirit of the invention, it is understood that the invention is not to be limited to said details except as set forth in the appended claims.

What is claimed is:

1. A memory system of the type having an array of memory cells selectively addressed by row and column signals, said signals being generated from row and column address buffers, said buffers including a plurality of flip-flops, said flip-flops including a pair of cross-coupled transistors having set and reset nodes, said set node being coupled to a first load transistor for charging said set node at a rate proportional to the potential on a set control node, said reset node being coupled to a second load transistor for charging said reset node at a rate proportional to the potential on a reset control node, the improvement comprising:
a. equalizing means for equalizing the voltage of said set and reset nodes;
b. precharge means for applying a precharge to said set control node and said reset control node;
c. means for generating a voltage difference between said set node and said reset node in response to an input address signal; and
d. current sinking means for sensing a voltage difference between said set node and said reset node and for selectively sinking said precharge from one of said control nodes in response thereto.

2. A memory system according to claim 1, wherein all of said transistors are MOS transistors.

3. A memory system according to claim 2, wherein said current sinking means includes first and second MOS sink transistors; said first sink transistor having a gate coupled to said reset node, and having a source coupled to said set control node; said second sink transistor having a gate coupled to said set node, and having a source coupled to said reset control node.

4. A memory system according to claim 3, wherein said current sinking means includes third and fourth MOS sink transistors; said third sink transistor having a gate coupled to said reset node and having a source coupled to the drains of said first sink transistor and said set transistor; said fourth sink transistor having a gate coupled to said set node and having a source coupled to the drains of said second sink transistor and said reset transistor.

5. A memory system according to claim 3, wherein said current sinking means includes third and fourth MOS sink transistors; said third sink transistor having a clocked gate, and a source coupled to the drains of said first sink transistor and said set transistor; said fourth sink transistor having a clocked gate, and a source coupled to the drains of said second sink transistor and said reset transistor.

6. A memory system according to claim 2, wherein said equalizing means is a transistor having a source and a drain coupled to said set node and said reset node respectively, and having a clocked gate.

7. A memory system according to claim 2, wherein said precharge means includes first, second, and third percharge transistors; said first precharge transistor having a drain coupled to said set control node; said second precharge transistor having a drain coupled to said reset control node; said third precharge transistor having a source coupled to said set control node, and having a drain coupled to said reset control node; each of said precharge transistors having a clocked gate.

8. A memory system according to claim 2, wherein said address input means includes a first input transistor having a source coupled to said reset node, and a gate capable of receiving an input logic signal.

9. A memory system according to claim 2, wherein each of said flip-flops includes an output circuit coupled to said set control node and coupled to said reset control node.

10. A memory system according to claim 9, wherein said output circuit includes an output load transistor having a gate coupled to said set control node; and an output driver transistor having a gate coupled to said reset control node and having a source coupled to the drain of said output load transistor.

11. A memory system according to claim 9, wherein said output circuit includes an output load transistor having a gate coupled to said reset control node; and an output driver transistor having a gate coupled to said set control node and having a source coupled to the drain of said output load transistor.

12. A buffer circuit, for latching logic signals, comprising:
a. set and reset transistors being cross-coupled to form set and reset nodes;
b. first load transistor means having an output coupled to said set node for charging said set node, and having a set control node for varying the conductivity of said first load transistor in proportion to the charge applied thereto;
c. second load transistor means having an output coupled to said reset node for charging said reset node, and having a reset control node for varying the conductivity of said second load transistor in proportion to the charge applied thereto;
d. equalizing means for equalizing the voltage on said set and reset nodes;
e. precharge means for applying a precharge voltage on said set control node and said reset control node, thereby making each of said load transistors slightly conductive;
f. address input means coupled to said reset node for sinking charge from said reset node in response to a first state of an input address signal; and
g. current sinking means coupled to said set and reset nodes, and to said set control node and reset control node; said current sinking means selectively sinking charge from said set control node or said reset control node in response to a voltage difference between said set and reset nodes.

13. A buffer circuit according to claim 12, wherein all of said transistors are MOS transistors.

14. A buffer circuit according to claim 13, wherein said current sinking means includes first and second sink transistors; said first sink transistor having a gate coupled to said reset node, and having a source coupled to said set control node; said second sink transistor having a gate coupled to said set node, and having a source coupled to said reset control node.

15. A buffer circuit according to claim 13, wherein said current sinking means includes third and fourth sink transistors; said third sink transistor having a gate coupled to said reset node and having a source coupled to the drains of said first sink transistor having a gate coupled to said set node and having a source coupled to the drains of said second sink transistor and said reset transistor.

16. A buffer circuit according to claim 13, wherein each of said flip-flops includes an output circuit coupled to said set control node and coupled to said reset control node.

17. A buffer circuit according to claim 16 wherein said output circuit includes an output load transistor having a gate coupled to said set control node; and an output driver transistor having a gate coupled to said reset control node and having a source coupled to the drain of said output load transistor.

18. A buffer circuit according to claim 16, wherein said output circuit includes an output load transistor having a gate coupled to said reset control node; and an output driver transistor having a gate coupled to said set control node and having a source coupled to the drain of said output load transistor.

* * * * *